(12) United States Patent
Billet et al.

(10) Patent No.: US 9,293,707 B2
(45) Date of Patent: Mar. 22, 2016

(54) SUBSTRATE WITH A FUNCTIONAL LAYER COMPRISING A SULPHUROUS COMPOUND

(71) Applicants: AGC Glass Europe, Louvain-la-Neuve (BE); Asahi Glass Company Limited, Tokyo (JP)

(72) Inventors: Sophie Billet, Gosselies (BE); Benoit Domercq, Gosselies (BE); Philippe Roquiny, Gosselies (BE); Yuki Aoshima, Tokyo (JP)

(73) Assignees: AGC Glass Europe, Louvain-la-Neuve (BE); Asahi Glass Company Limited, Tokyo (JP)

( * ) Notice: Subject to any disclaimer, the term of this patent is extended or adjusted under 35 U.S.C. 154(b) by 8 days.

(21) Appl. No.: 14/360,462

(22) PCT Filed: Oct. 9, 2012

(86) PCT No.: PCT/EP2012/069927
§ 371 (c)(1),
(2) Date: May 23, 2014

(87) PCT Pub. No.: WO2013/075879
PCT Pub. Date: May 30, 2013

(65) Prior Publication Data
US 2014/0319687 A1    Oct. 30, 2014

(30) Foreign Application Priority Data
Nov. 23, 2011 (BE) .................................. 2011/0681

(51) Int. Cl.
*H01L 51/00* (2006.01)
*H01L 51/52* (2006.01)
*H01L 21/4763* (2006.01)
*H01L 51/44* (2006.01)

(52) U.S. Cl.
CPC ...... *H01L 51/0023* (2013.01); *H01L 21/47635* (2013.01); *H01L 51/0017* (2013.01); *H01L 51/448* (2013.01); *H01L 51/5203* (2013.01); *H01L 51/5237* (2013.01)

(58) Field of Classification Search
USPC .......................................... 257/751; 438/669
See application file for complete search history.

(56) References Cited

U.S. PATENT DOCUMENTS

2010/0117523 A1    5/2010   Tchakarov

FOREIGN PATENT DOCUMENTS

| FR | 2 913 146 | 8/2008 |
|----|-----------|--------|
| JP | 2009 26786 | 2/2009 |

OTHER PUBLICATIONS

Machine translation of Koichi et al. (JP 2009-026786).*

(Continued)

*Primary Examiner* — Yasser A Abdelaziez
(74) *Attorney, Agent, or Firm* — Oblon, McClelland, Maier & Neustadt, L.L.P.

(57) ABSTRACT

The invention relates to a substrate (1) comprising a medium (10), said medium (10) comprising, on at least one of its main faces, a functional layer (11) that has low-E or antisolar properties or is electrically conductive, characterized in that said functional layer (11) comprises, on its extreme surface opposite the medium (10), at least one sulphurous compound, in particular a sulphate, a sulphonate and/or a thiosulphate.

25 Claims, 4 Drawing Sheets

(56) References Cited

OTHER PUBLICATIONS

Black, A. J. et al. "Patterning Disorder in Monolayer Resists for the Fabrication of Sub-100-nm Structures in Silver, Gold, Silicon, and Aluminum" J. Am. Chem. Soc., vol. 121, No. 36, pp. 8356-8365, 1999 XP002438800.

International Search Report Issued Jan. 21, 2013 in PCT/EP12/069927 Filed Oct. 9, 2012.

* cited by examiner

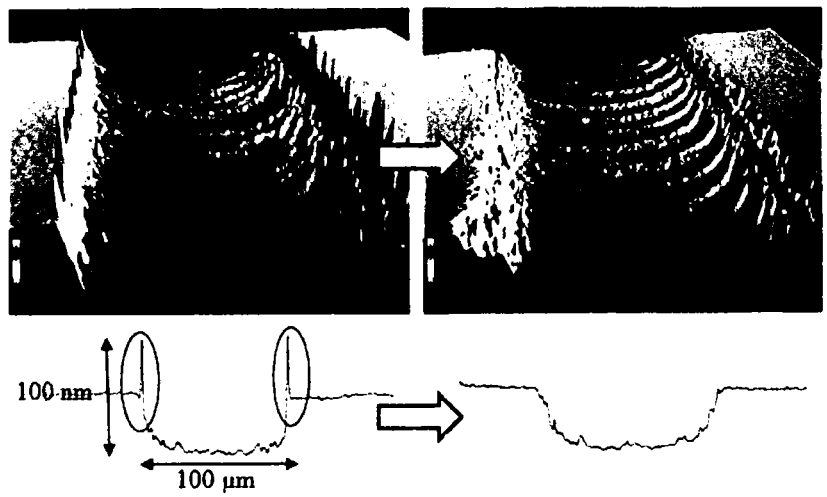
Fig. 3A  Fig. 3C
Fig. 3B  Fig. 3D
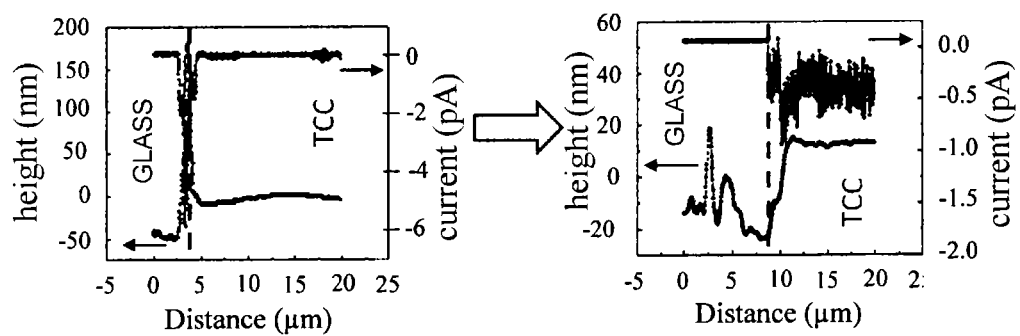
Fig. 4A  Fig. 4B

SUBSTRATE WITH A FUNCTIONAL LAYER COMPRISING A SULPHUROUS COMPOUND

1. FIELD OF THE INVENTION

The field of the invention is that of substrates comprising a functional film providing electrical conduction properties.

More precisely, the invention relates to a substrate comprising an electrically conductive functional film, said functional film comprising an interfacial sulfur-containing compound. The present invention also relates to processes for manufacturing these substrates and to the optoelectronic devices in which these substrates are incorporated.

The expression "optoelectronic devices" is understood to denote organic light-emitting devices known by the acronym OLED (organic light-emitting diode), light capturing devices such as organic photovoltaic cells known by the acronym OPV (organic photovoltaics), organic thin-film transistors (OTFT) and Grätzel solar cells, also called dye sensitized solar cells (DSSCs), preferably the above expression is understood to denote organic light-emitting devices.

2. PRIOR ART

Substrates comprising a functional film providing electrical conduction properties are especially obtained by magnetron sputtering said functional film onto a carrier. Using this type of technique makes it possible to obtain smooth surfaces. However, substrates comprising a functional film providing electrical conduction properties, used in various optoelectronic devices, contain a discontinuity in the form of an etched region. The etching of conductive films is a critical element if the devices produced using such structures are to work properly. This etching enables the optoelectronic modules to be separated and its quality is paramount to ensure said modules preserve their optical and/or electrical properties. The etching may be carried out using a laser beam.

Under standard conditions of use, the laser beam is responsible for substantial electrical leakage currents. These leakage currents limit the performance in terms of efficiency and lifetime of the optoelectronic devices. In the case of organic light-emitting diodes (OLEDs), their edges are thus observed to emit light when a voltage is applied. Such effects are due to substantial modification of the nature of the materials used in the conductive functional film and to topographic modification, i.e. modification of the thickness, of said film by the laser beam. More particularly, when said film is based on a multilayer comprising one or more dielectric film/metal film/dielectric film stacks in succession. There are means for limiting these problems such as using a laser with very particular characteristics (for example: pico/femto-second irradiation or the use of particular wavelengths, for example in the UV). However, although these techniques are increasingly available, in certain cases they cannot be industrialized.

Various so-called "wet etching" solutions are already known to improve the topographic properties of certain conductive films after laser etching, more particularly transparent conductive films used in various optoelectronic applications. Thus solutions based on an acid (such as HCl, HBr, etc.), on $FeCl_3$ and on $H_2O$ are used to wet etch functional films comprising a silver film. Examples of such solutions are described in the following articles by Y. Aoshima et Coll., "Development of silver-based multilayer coating electrodes with low resistance for use in flat panel displays", Jpn. J. Appl. Phys., Vol. 39, pp. 4884-4889 (2000) and Y. Aoshima et Coll., "Improvement of alkali durability of silver-based multilayer coatings for use in flat panel displays", Jpn. J. Appl. Phys., Vol. 40, pp. 4166-4170 (2001).

However, these solutions are, by their nature, relatively aggressive towards the functional film and may cause deterioration of the materials, more particularly of the surface of the functional film, when the latter comprises a film multilayer.

3. AIM OF THE INVENTION

The aim of the invention is especially to mitigate these drawbacks of the prior art.

More precisely, the invention, in at least one of its embodiments, is intended to provide a substrate comprising a functional film comprising at least one metallic film and providing electrical conduction properties, said film being discontinuous, the discontinuity being more particularly obtained by laser etching.

The invention is also intended to provide a process for passivating functional films comprising at least one metallic film, said functional film being mechanically etched (for example scribed) or etched with a laser, said process also including a subsequent treatment after the laser etch, this treatment not only reducing topographic damage induced by the action of the laser beam but also isolating the edges of the laser-etched region in the functional film comprising at least one metallic film.

Finally, the present invention also intends to provide an optoelectronic device incorporating a substrate according to the present invention, more particularly an organic light-emitting diode or an organic photovoltaic cell.

4. SUMMARY OF THE INVENTION

According to one variant, the invention relates to a substrate comprising a carrier, said carrier comprising, on at least one of its main faces, a functional film providing electrical conduction properties, said functional film comprising at least one metallic film.

According to the invention, such a functional film comprises, on its extreme surface, opposite the carrier (i.e. the most external surface of the functional film relative to the carrier, or in other words that surface, of the functional film, which is furthest from the carrier) at least one sulfur-containing compound in the form of a thiosulfate.

The general principle of the invention is based on the presence, on the extreme surface of the functional film, of at least one sulfur-containing compound in the thiosulfate form, the presence of said sulfur-containing compound passivating the surface of the functional film.

Thus, the invention is based on a completely novel and inventive approach of passivating the functional film, the inventors having surprisingly observed that the presence of a sulfur-containing compound on the extreme surface produces such a passivation. The expression "presence of a sulfur-containing compound on the extreme surface" is understood to mean a sulfur content expressed in atomic percent of at least 0.4% over a thickness of 10 nm, said percentage being measured by XPS photoelectron spectroscopy.

The carrier on which the functional film is deposited is preferably stiff. The function of the carrier is to support and/or protect the functional film. According to a variant, the surface of at least one of the faces of the carrier comprises at least a complete or partial structuring. Generally, the carrier is structured using at least one process selected from chemical attack, rolling, and/or laser etching. Chemical attack of the carrier comprises at least frosting and/or etching it (for example using hydrofluoric acid to attack a soda-lime-silica glass). Rolling processes comprise at least one step of structuring the substrate by printing a pattern under pressure using at least one imprinting roller. The substrate may be made of glass, a rigid plastic (for example: organic glass, polycarbonate) or of flexible polymer sheets (for example: polyvinyl butyral (PVB), polyethylene terephthalate (PET), ethylene vinyl acetate (EVA)). Preferably, the carrier is a glass sheet. The glass is either mineral or organic glass. Mineral glasses are preferred. Among the latter, clear or bulk- or surface-tinted soda-lime-silica glass is preferred. More preferably, extra-clear soda-lime-silica glass is used. The expression "extra-clear" is understood to denote glass containing at most 0.020%, by weight of the glass, total Fe, expressed in $Fe_2O_3$, and preferably at most 0.015% by weight. The carrier preferably has a geometric thickness of at least 0.35 mm. The expression "geometric thickness" is understood to mean the average physical thickness.

The term "film" is understood, in the present invention, to mean that said film may consist of a film made of a single material or of a plurality of films each made of a different material. The functional film may thus be an electrically conductive film comprising at least one metallic silver-based film, silver being present in its pure form or alloyed with another metal, its pure form being preferred. When the electrically conductive functional film comprises at least one metallic silver-based film, said metallic silver-based film is protected on either side by at least one oxide- or nitride-based film. When the silver is alloyed, the other metal(s) preferably comprise at least palladium and/or gold, more preferably palladium. When the functional film is an electrically conductive functional film comprising at least one metallic silver-based film, said film also comprises a set of dielectric films placed on either side of said metallic silver-based film. The metallic silver-based film has a geometric thickness of at least 5.0 nm, preferably of at least 9.0 nm. The metallic silver-based film has a geometric thickness of 25.0 nm at most, preferably 18.0 nm at most, and more preferably 14.0 nm at most. Even more preferably, the metallic silver-based film is 12.5 nm in thickness. The electrically conductive film e may comprise a plurality of metallic silver-based films, preferably two metallic silver-based films, said films being separated by dielectric films making the carrier covered with a functional film according to the invention antireflective in a part of the solar spectrum, in particular in the visible wavelength range. Mention will be made, by way of example of an antisolar functional film, of the products sold under the trade name "Stopray" by AGC, and by way of example of a low-E coating, the products sold by the same company under the trade names "TopN", "TopN+" and "TopN+T".

According to one embodiment, the electrically conductive, low-E or antisolar functional film comprising at least one metallic silver-based film also comprises at least one means providing said silver film with chemical protection. The expression "chemical protection" is understood to mean that the silver is protected from any chemical degradation effect (oxidation, diffusion of alkali-metal ions from the glass sheet, diffusion of silver during the tempering heat treatment). Among such means, mention may be made by way of example of:

at least one barrier film, said barrier film being, relative to the glass sheet, the first film in the low-E or antisolar electrically conductive functional film. The barrier film is made of a material selected from titanium oxide, zinc oxide, silicon nitride, silicon oxynitride, silicon oxycarbide, silicon oxycarbonitride, aluminum nitride, aluminum oxynitride, aluminum oxide, this barrier film optionally being doped or alloyed with tin. The barrier film has a geometric thickness of at least 3.0 nm, preferably at least 10.0 nm, more preferably at least 30.0 nm and even more preferably at least 50.0 nm. The thickness of the barrier film is 100 nm at most;

at least one sacrificial film, the sacrificial film being located on at least one face of the metallic silver-based film. The term "sacrificial film" is understood to mean a film that can be completely or partially oxidized. This film makes it possible to prevent deterioration of the silver film, especially by oxidation. When it is present, the sacrificial film comprises at least one compound chosen from metals, nitrides, oxides and oxygen substoichiometric metal oxides. Preferably the metals, nitrides, oxides and substoichiometric metal oxides comprise at least one element selected from Ti, Zr, Hf, V, Nb, Ta, Cr, Mo, W, Mn, Fe, Co, Ni, Cu, Zn, Al. More preferably, the sacrificial film comprises at least Ti, $TiO_x$ (where $x \leq 2$) or NiCr. The thickness of the sacrificial films is at least 0.5 nm. The thickness of the sacrificial film is 6.0 nm at most. More preferably, the thickness is between 1.0 and 2.5 nm. According to a preferred embodiment, a sacrificial film is deposited on that face, of the metallic silver-based film, which is furthest from the carrier.

According to a preferred embodiment, the substrate according to the invention is such that the electrically conductive functional film comprises a thin film promoting uniform surface electrical properties, said uniformity-promoting film being that film, within the functional film, which is furthest from the carrier. The main function of the uniformity-promoting film is to provide uniform charge transfer over the entire area of the functional film. This uniform transfer means that, when the conductive functional film is used as an electrode in an OLED device, the emitted or converted light flux is equivalent at every point over the surface. It also makes it possible to increase the lifetime of optoelectronic devices, because, since the same amount of charge is transferred at each point, possible hot spots are eliminated. The uniformity-promoting film has a geometric thickness of at least 0.5 nm, preferably at least 1.0 nm. The uniformity-promoting film has a geometric thickness of 5.0 nm at most, preferably 2.5 nm at most and more preferably 2.0 nm at most. More preferably, the uniformity-promoting film is 1.5 nm in thickness. The uniformity-promoting film comprises at least one film comprising at least one inorganic material selected from a metal, a nitride, an oxide, a carbide, an oxynitride, an oxycarbide, a carbonitride, an oxycarbonitride and mixtures of at least two of these materials.

According to a first particular variant of the preceding embodiment, the inorganic material of the uniformity-promoting film comprises a single metal or a mixture of metals. The generic expression "mixture of metals" is understood to mean an alloy of at least two metals or at least one metal doped with at least one other metal. The uniformity-promoting film comprises at least those metals belonging to columns 1, 2, 4, 5, 6, 7, 8, 9, 10, 11, 12, 13, 14 of the version of the Periodic Table of the Elements published by the IUPAC on 22 Jun. 2007. The metal and/or the mixture of metals comprises at least one element selected from Li, Na, K, Rb, Mg, Ca, Sr, Ba, Ti, Zr, Hf, V, Nb, Ta, Cr, Mo, W, Mn, Co, Ni, Pd, Pt, Cu, Ag, Au, Zn, Cd, Al, Si and C. More preferably, the metal or the mixture of metals comprises at least one element selected from C, Ti, Zr, Hf, V, Nb, Ta, Ni, Cr, Al and Zn. The mixture of metals preferably comprises Ni—Cr and/or Al-doped Zn. The advantage of this variant is that it allows the best possible compromise to be obtained between, on the one hand, the electrical properties resulting from the effect of the uniformity-promoting film on the surface electrical properties and, on the other hand, the optical properties obtained by virtue of the optical optimization film. Using a uniformity-promoting film having the smallest possible thickness is essential. This is because, the smaller its thickness, the greater the amount of light emitted or converted by the optoelectronic device.

According to a second variant, the inorganic material of the uniformity-promoting film is present in the form of at least one chemical compound selected from carbides, carbonitrides, oxynitrides, oxycarbides, oxycarbonitrides, and mixtures of at least two of these compounds. The oxynitrides, oxycarbides and oxycarbonitrides of the uniformity-promoting film may be nonstoichiometric and preferably substoichiometric in oxygen. The carbides, carbonitrides, oxynitrides, oxycarbides and oxycarbonitrides are carbides, carbonitrides, oxynitrides, oxycarbides and oxycarbonitrides of at least one element selected from those belonging to columns 2, 4, 6, 7, 8, 9, 10, 11, 12, 13, 14 of the version of the Periodic Table of the Elements published by the IUPAC on 22 Jun. 2007. Preferably they are carbides, carbonitrides, oxynitrides, oxycarbides and oxycarbonitrides of at least one element selected from Ti, Zr, Hf, V, Nb, Ta, Cr, Mo, W, Mn, Co, Ni, Pd, Pt, Cu, Ag, Au, Zn, Cd, Al, and Si. More preferably they are carbides, carbonitrides, oxynitrides, oxycarbides and oxycarbonitrides of at least one element selected from Ti, Zr, Hf, V, Nb, Ta, Ni, Cr, Al, and Zn. The carbides, carbonitrides, oxynitrides, oxycarbides and oxycarbonitrides of the film promoting uniform surface electrical properties optionally comprise at least one dopant. In a preferred embodiment, the thin uniformity-promoting film comprises at least one oxynitride comprising at least one element selected from Ti, Zr, Cr, Mo, W, Mn, Co, Ni, Pd, Pt, Cu, Ag, Au, Zn, Cd, Al, and Si. More preferably, the thin film promoting uniform surface electrical properties comprises at least one oxynitride chosen from Ti oxynitride, Zr oxynitride, Ni oxynitride and NiCr oxynitride.

According to a third variant, the inorganic material of the uniformity-promoting film takes the form of at least one nitride of at least one metal selected from those belonging to columns 4, 5, 6, 7, 8, 9, 10, 11, 12, 13, 14 of the Periodic Table of the Elements published by the IUPAC on 22 Jun. 2007. Preferably, the uniformity-promoting film comprises at least one nitride of an element selected from Ti, Zr, Hf, V, Nb, Ta, Cr, Mo, W, Mn, Co, Ni, Pd, Pt, Cu, Ag, Au, Zn, Cd, Al, and Si. More preferably, the nitride comprises at least one element selected from Ti, Zr, Hf, V, Nb, Ta, Ni, Cr, Al, and Zn. More preferably, the thin film promoting uniform surface electrical properties comprises at least Ti nitride, Zr nitride, Ni nitride or NiCr nitride.

According to a fourth variant, the inorganic material of the uniformity-promoting film takes the form of at least one oxide of at least one metal selected from those belonging to columns 4, 5, 6, 7, 8, 9, 10, 11, 12, 13, 14 of the Periodic Table of the Elements published by the IUPAC on 22 Jun. 2007. Preferably, the uniformity-promoting film comprises at least one oxide of an element selected from Ti, Zr, Hf, V, Nb, Ta, Cr, Mo, W, Mn, Co, Ni, Pd, Pt, Cu, Ag, Au, Zn, Cd, Al, In, Si, and Sn. More preferably, the oxide comprises at least one element selected from Ti, Zr, Hf, V, Nb, Ta, Ni, Cr, Al, In, Sn, and Zn. The oxide of the uniformity-promoting film may be an oxygen substoichiometric oxide. The oxide optionally comprises at least one dopant. Preferably the dopant is selected from at least one of the following elements Al, Ga, In, Sn, Sb and F. More preferably, the thin film promoting uniform surface electrical properties comprises at least Ti oxide and/or Zr oxide and/or Ni oxide and/or NiCr oxide and/or ITO and/or doped Sn oxide, the dopant being at least one element chosen from F and Sb, and/or doped Zn oxide, the dopant being at least one element chosen from Al, Ga, Sn and Ti.

According to a preferred embodiment, the substrate according to the invention is such that the electrically conductive functional film comprises a film inserted between the metallic silver-based film and the uniformity-promoting film comprising at least one inorganic chemical compound. This insertion film forms part of an optical cavity making it possible to make the metallic silver-based film transparent. The expression "inorganic chemical compound" is understood to mean at least one dielectric compound and/or at least one electrically conductive compound. The dielectric compound comprises at least one compound chosen from the oxides, nitrides, carbides, oxynitrides, oxycarbides, carbonitrides, oxycarbonitrides and mixtures of at least two of these compounds. The oxides, nitrides, carbides, oxynitrides, oxycarbides, carbonitrides or oxycarbonitrides of the dielectric compound are oxides, nitrides, carbides, oxynitrides, oxycarbides, carbonitrides or oxycarbonitrides of at least one element selected from Ti, Zr, Hf, Ta, Cr, Mo, Zn, Al, In, Si, Sn, Sb, and Bi. When it is present, the dielectric compound preferably comprises a titanium oxide, a zinc oxide, a tin oxide, an aluminum nitride, a silicon nitride and/or a silicon carbide. When it is present, the conductor comprises at least one compound chosen from oxygen substoichiometric oxides, doped oxides, doped nitrides, doped carbides, doped oxynitrides, doped oxycarbides, doped carbonitrides, doped oxycarbonitrides and mixtures of at least two of these compounds. The substoichiometric oxides, doped oxides, doped nitrides, doped carbides, doped oxynitrides, doped oxycarbides, doped carbonitrides or doped oxycarbonitrides of the conductive compound are substoichiometric oxides, doped oxides, doped nitrides, doped carbides, doped oxynitrides, doped oxycarbides, doped carbonitrides or doped oxycarbonitrides of at least one element selected from Ti, Zr, Ta, Cr, Mo, Zn, Al, In, Si, Sn, and Sb. Preferably, the dopants comprise at least one of the following elements Al, Ga, In, Sn, P, Sb, and F. More preferably, the conductive compound comprises at least ITO and/or doped Sn oxide, the dopant being at least one element chosen from F and Sb, and/or doped Zn oxide, the dopant being at least one element chosen from Al, Ga, Sn and Ti. According to a preferred embodiment, the inorganic chemical compound comprises at least $ZnO_x$ (where x≤1) and/or $Zn_xSn_yO_z$ (where x+y≥3 and z≤6). Preferably the $Zn_xSn_yO_z$ comprises at most 95 wt % zinc, the percentage zinc by weight is expressed relative to the total weight of the metals present in the film. The insertion film has a geometric thickness of at least 3.0 nm. The insertion film has a geometric thickness of 50.0 nm at most, preferably 20.0 nm at most and more preferably 10.0 nm at most.

According to a variant, the substrate according to the invention is such that the electrically conductive functional film comprises at least one optical optimization film inserted between the metallic silver-based film and the carrier. This optimization film allows, by virtue of its thickness and its chemical nature, a high luminous flux to be obtained. It comprises at least one inorganic chemical compound. The expression "inorganic chemical compound" is understood to mean at least one dielectric compound and/or at least one electrically conductive compound. The dielectric compound comprises at least one compound chosen from the oxides, nitrides, carbides, oxynitrides, oxycarbides, carbonitrides, oxycarbonitrides and mixtures of at least two of these compounds. The oxides, nitrides, carbides, oxynitrides, oxycarbides, carbonitrides or oxycarbonitrides of the dielectric compound are oxides, nitrides, carbides, oxynitrides, oxycarbides, carbonitrides or oxycarbonitrides of at least one element selected from Ti, Zr, Hf, Nb, Ta, Cr, Mo, Zn, Al, In, Si, Sn, Sb, and Bi. When it is present, the dielectric compound preferably comprises a titanium oxide, a zirconium oxide, a hafnium oxide, a niobium oxide, a tantalum oxide, a zinc oxide, an aluminum nitride, a silicon nitride and/or a silicon carbide. When it is present, the conductor comprises at least one compound chosen from oxygen substoichiometric oxides, doped oxides, doped nitrides, doped carbides, doped oxynitrides, doped oxycarbides, doped carbonitrides, doped oxycarbonitrides and mixtures of at least two of these compounds. The substoichiometric oxides, doped oxides, doped nitrides, doped carbides, doped oxynitrides, doped oxycarbides, doped carbonitrides or doped oxycarbonitrides of the conductive compound are substoichiometric oxides, doped oxides, doped nitrides, doped carbides, doped oxynitrides, doped oxycarbides, doped carbonitrides or doped oxycarbonitrides of at least one element selected from Ti, Zr, Ta, Cr, Mo, Zn, Al, In, Si, Sn, P, and Sb. Preferably, the dopants comprise at least one of the following elements Al, Ga, In, Sn, P, Sb, and F. More preferably, the conductive compound comprises at least ITO and/or doped Sn oxide, the dopant being at least one element chosen from F and Sb, and/or doped Zn oxide, the dopant being at least one element chosen from Al, Ga, Sn and Ti. According to a preferred embodiment, the inorganic chemical compound comprises at least $ZnO_x$ (where $x \leq 1$) and/or $Zn_xSn_yO_z$ (where $x+y \geq 3$ and $z \leq 6$). Preferably the $Zn_xSn_yO_z$ comprises at most 95 wt % zinc, the percentage zinc by weight is expressed relative to the total weight of the metals present in the film. The optical optimization film has a geometric thickness of at least 3.0 nm, preferably of at least 10.0 nm, more preferably of at least 30.0 nm and even more preferably of at least 50.0 nm. The optical optimization film is at most 100 nm in thickness.

According to a variant, the substrate according to the invention is such that the electrically conductive functional film comprises at least one additional crystallization film inserted between the carrier and the metallic silver-based film. This film allows preferential growth of the metallic silver-based film and thereby makes it possible to obtain a metallic silver-based film with good electrical and optical properties. It comprises at least one inorganic chemical compound. The expression "inorganic chemical compound" is understood to mean $ZnO_x$ (where $x \leq 1$) and/or $Zn_xSn_yO_z$ (where $x+y \geq 3$ and $z \leq 6$). Preferably the $Zn_xSn_yO_z$ comprises at most 95 wt % zinc, the percentage zinc by weight is expressed relative to the total weight of the metals present in the film. The crystallization film has a geometric thickness of at least 3.0 nm. The crystallization film has a thickness of 50.0 nm at most, preferably 20.0 nm at most, more preferably 10.0 nm at most. According to a variant, the crystallization film and the barrier film and/or the optical optimization film are one and the same film.

According to another preferred embodiment, the sum of the geometric thicknesses of the barrier, optical optimization and crystallization films is at least 3.0 nm, is preferably at least 10.0 nm, is more preferably at least 30.0 nm and is even more preferably at least 50.0 nm. Preferably, the sum of the thicknesses of the films is at most 100 nm.

According to a preferred embodiment of the barrier and crystallization films, at least one of these two films is also the optical optimization film.

The barrier, optimization, crystallization and insertion films may have the same chemical nature or different chemical natures. The expression "different chemical natures" does not exclude combinations such as: 3 films of identical nature and one of a different nature; or two films of identical nature, the two remaining films either both having the same nature or having different natures.

According to another variant, the substrate according to the invention is such that it comprises, between the carrier and the uniformity-promoting film, at least one additional multilayer: metallic silver-based film/insertion film. This multilayer may be reproduced n times, where n is an integer equal to 1 or more. The multilayer forming the electrically conductive functional film is, preferably, a multilayer comprising from one to three metallic silver-based films, preferably one or two metallic silver-based films.

According to a preferred embodiment, the substrate according to the invention essentially has the following structure, starting from the carrier:
- a combined barrier and optical optimization film: 50-80 nm of $TiO_2$;
- a crystallization film: 3-20 nm of $Zn_xSn_yO_z$ such as defined above;
- a metallic silver-based film: 8-14 nm of pure Ag;
- a sacrificial film: 1-3 nm Ti;
- an insertion film: 3-20 nm $Zn_xSn_yO_z$ such as defined above; and
- a uniformity-promoting film: 0.5-3 nm made of X, where X is: Li, Mg, Cu, Ti, Zr, Hf, V, Nb, Ta, Ni, Pd, Cr, Mo, Al, Zn, NiCr or Al-doped Zn; of a nitride of X where X is: Ti, Zr, Hf, V, Nb, Ta, Ni, Pd, Cr, Mo, Al, Zn, Ni—Cr; of an oxynitride of X where X is: Ti, Zr, Cr, Mo, W, Mn, Co, Ni, Pd, Pt, Cu, Ag, Au, Zn, Cd, Al, Si or of NiCr; or of an oxide of X where X is: Ti, Zr, Hf, V, Nb, Ta, Ni, Pd, Cr, Mo, Al, Zn, NiCr or Al-doped Zn.

According to one variant, the substrate according to the invention is such that the functional film is a discontinuous film taking the form of separate adjacent zones, especially taking the form of parallel strips.

According to an advantageous embodiment, the substrate according to the invention is such that the thickness of said discontinuous functional film, from the middle of a zone to the edge of a zone, varies by less than 30%, preferably less than 15%, more preferably less than 5% and even more preferably less than 1%.

According to a preferred embodiment, the substrate according to the invention forms the anode of an optoelectronic device, and more preferably it forms the anode of a organic light-emitting diode (OLED).

Another subject of the invention is a process for manufacturing a substrate equipped with a functional film according to the invention. According to a first advantageous implementation, the invention relates to a process for passivating the surface of a substrate equipped with a functional film, such that it comprises the following steps in succession:
- a step of depositing the functional film on at least one part of the support;
- a step of passivating the surface by applying a preferably aqueous passivating solution containing thiosulfate ions; and
- optionally, thereafter, a step of rinsing in a protic polar solvent, preferably a water-based solvent.

The step of depositing the functional film is carried out by sputtering, optionally magnetron sputtering. Preferably, the deposition process is a vacuum deposition process. The term "vacuum" denotes a pressure of 1.2 Pa or less. More preferably, the vacuum process is a magnetron sputtering technique.

The passivation solution comprising thiosulfate anions used in the passivating step is preferably a solution based on a protic polar solvent, the preferred solvent being water and more preferably deionized water. Water makes it possible, on the one hand, to obtain higher thiosulfate concentrations, and on the other hand, to prevent contamination of the surface with carbon. The passivating solution is a solution comprising a thiosulfate anion concentration of at least 0.1 M or more, preferably of at least 0.5 M or more, more preferably of at least 0.8 M or more and even more preferably of about 1.0 M. Preferably, the passivating solution is based on thiosulfate anions. The expression "based on" is here understood to mean that thiosulfate anions represent at least 50% of the anions present in the passivation solution. The thiosulfate salts used to prepare the passivating solution are thiosulfates of K and/or Na. Preferably, the passivating solution is a solution containing only thiosulfate anions, other ions that are liable to be present being present in only trace amounts. Preferably, the passivating solution is an aqueous solution comprising 1.0 M of Na thiosulfate. The passivating solution may be applied using roller, spray, screen or dip application techniques. In the case of application by dipping, it will be understood that the substrate covered with the film multilayer is dipped into the passivating solution. The passivating solution may be stirred during the dipping, the stirring being performed mechanically or ultrasonically, preferably the stirring is ultrasonic for reasons of uniformity of the flow of solvent toward the surface of the functional film to be passivated. Preferably, the solution is not stirred, the lack of stirring permitting better control of the passivation. Preferably, the passivating solution is applied to the surface to be treated at room temperature, the time for which the solution is applied depending on the concentration of said solution, the inventors have observed that surprisingly the action of the passivating solution is optimal when the application time and the concentration of the thiosulfate solution is at least equal to $t=4e^{-0.139c}-0.25$ and at most equal to $t=4e^{-0.139c}+0.25$, preferably at least equal to $t=4e^{-0.139c}-0.20$ and at most equal to $t=4e^{-0.139c}+0.20$, more preferably at least equal to $t=4e^{-0.139c}-0.15$ and at most equal to $t=4e^{-0.139c}+0.15$, and even more preferably at least equal to $t=4e^{-0.139c}-0.10$ and at most equal to $t=4e^{-0.139c}+0.10$. By modifying the temperature of the passivating solution, a person skilled in the art may easily:

reduce the duration of the application by increasing the temperature; and
  obtain better control of the passivating step by decreasing the temperature.

The protic polar solvent used in the optional rinsing step is preferably water and more preferably deionized water, the expression "deionized water" is understood to mean water having a conductivity of 1 µS/cm or less. Water makes it possible, on the one hand, to obtain higher thiosulfate anion concentrations, and, on the other hand, to prevent contamination of the surface with carbon. The rinsing solution may be applied using roller, spray, screen or dip application techniques. In the case of application by dipping, it will be understood that the substrate is dipped into the rinsing solution. Preferably, the rinsing solution is stirred during the dipping, the stirring being performed mechanically or ultrasonically. Preferably the stirring is ultrasonic, the inventors having observed that ultrasonic rinsing surprisingly also has a positive effect on the uniformity of the functional film.

According to an alternative implementation of the preceding embodiment, the process for passivating the surface of a substrate equipped with a functional film according to the invention is such that it comprises, between the steps of depositing the functional film and the passivating step, an additional etching step, said etching possibly being mechanical or laser etching. Preferably, the etching is laser etching. When it is carried out by laser, the etching step makes it possible to obtain a discontinuous functional film. However, this step causes peaks to appear on the surface of the functional film and more particularly at the edges of the etching zones, said peaks possibly being as much as 200% thicker than the initial thickness of the functional film. The inventors have demonstrated that the step of passivating the surface by applying a passivating solution comprising thiosulfate anions, advantageously followed by a step of rinsing in a protic polar solvent, surprisingly decreases said peaks or even causes them to disappear.

Another subject of the invention is an optoelectronic device comprising a substrate according to the invention.

5. LIST OF FIGURES

Other features and advantages of the invention will become more clearly apparent on reading the following description of a preferred embodiment, given by way of simple illustrative and nonlimiting example, and the appended drawings, in which:

FIG. 3 shows the effect of the passivation on the morphology of the etched film, before (3A, 3B) and after passivation (3C, 3D)

FIG. 4 shows CAFM measurements illustrating the effect of the passivation on the conductivity of the edges of the etched region;

6. DESCRIPTION OF AN EMBODIMENT OF THE INVENTION

In the following example an electrically conductive functional film having the following structure, starting from the carrier:

$TiO_2$ (65.0 nm)/$Zn_xSn_yO_z$ (5.0 nm)/Ag (12.5 nm)/Ti (2.5 nm)/ $Zn_xSn_yO_z$ (7.0 nm)/Ti nitride (1.5 nm)

was sputtered onto a 1.6 mm-thick clear glass carrier. The following were the deposition conditions for each of the films:

the $TiO_2$ film was deposited using a titanium target in an $Ar/O_2$ atmosphere at a pressure of 0.5 Pa;
  the $Zn_xSn_yO_z$ film was deposited using a ZnSn-alloy target in an $Ar/O_2$ atmosphere at a pressure of 0.5 Pa;
  the Ag film was deposited using an Ag target in an $Ar/O_2$ atmosphere at a pressure of 0.5 Pa;
  the Ti film was deposited using a Ti target in an Ar atmosphere at a pressure of 0.5 Pa, and it may have been partially oxidized by the subsequent $Ar/O_2$ plasma;
  the film promoting uniform surface electrical properties, based on Ti nitride, was deposited using a Ti target in an 80/20 $Ar/N_2$ atmosphere at a pressure of 0.5 Pa.

Said film was then etched using an Edgewave™ laser. The characteristics of the laser used for the etching are given in table I.

TABLE I

| characteristics of the laser used for the etching | |
|---|---|
| Type of laser | nanosecond |
| Wavelength | 532 nm |
| Frequency | 50 kHz |
| Pulse length | 12 ns |
| Maximum power | 40 W |
| Speed | 800 mm/s |

Figure 1A:
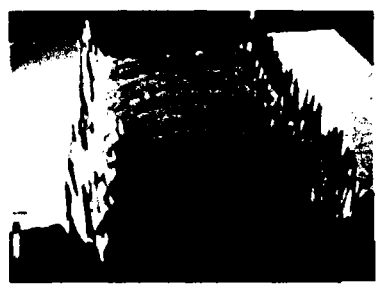
FIG. 1 shows the morphology of a laser-etching line observed by 3D microscopy.
Figure 1B:
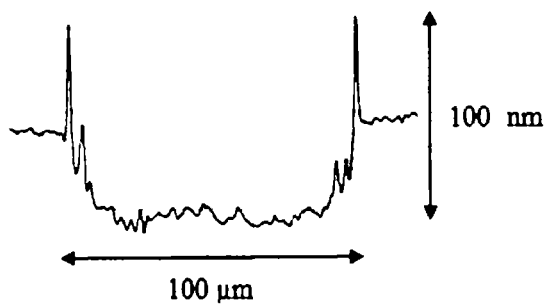

FIG. 1 shows the effect the laser beam had on the functional film. Under the action of the laser beam, the functional film underwent characteristic topographical damage resulting, in particular, in the formation of morphological peaks, corresponding to as much as a 200% increase in the initial thickness of the film.

Figure 2A:
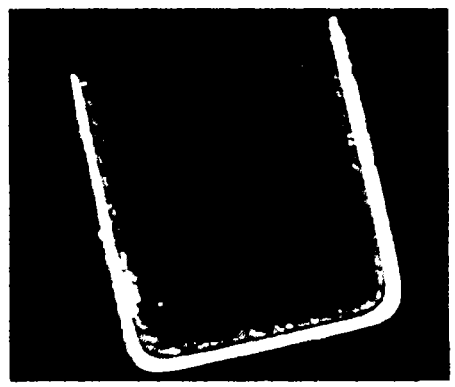
FIG. 2 illustrates the effect of the morphology resulting from the laser etching on an OLED device with a low turn-on voltage, showing (A) the presence of bright edges and (B) a simplified schema of the device studied.
Figure 2B:
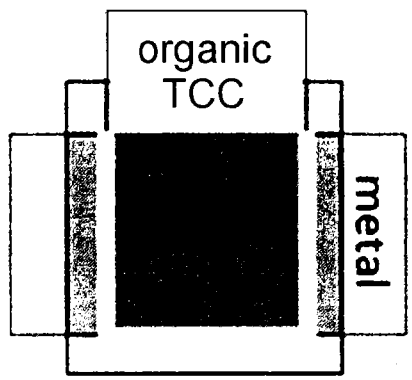
Figure 5A:
FIG. 5 shows the topography of a laser-etched line observed by 3D microscopy before passivation, and after 5 minutes and after 15 minutes submerged in the passivation solution.
Figure 5C:
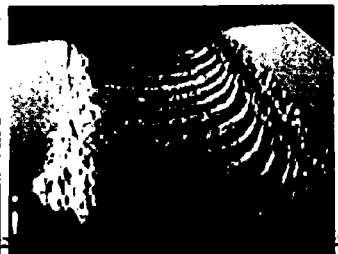
Figure 5E:
Figure 5B:
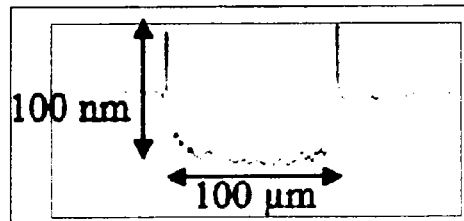
Figure 5D:
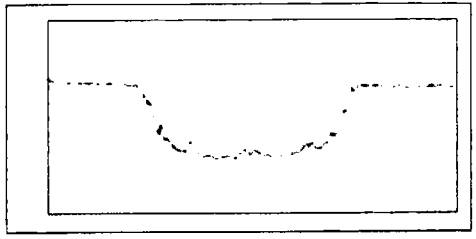
Figure 5F:
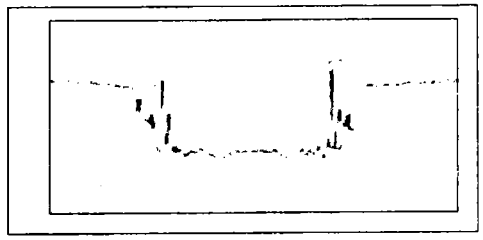

In the case of organic light-emitting devices, the presence of these peaks results in substantial leakage currents and sometimes in more pronounced emission from the edges of the etched region relative to the center of the device, leading to nonuniform illumination which is unacceptable from an esthetical point of view, as shown in FIG. 2A. The leakage currents correspond to currents flowing in the opposite direction to the current allowing the OLED device to operate. They are calculated based on the current densities ($mA/cm^2$) measured at −5 V.

The substrate obtained is then submerged in an aqueous solution of 1M of Na thiosulfate, without stirring, for 10 minutes at room temperature. The electrical passivation effect and the effect on the topography obtained are shown in FIGS. 3 and 4. Under the action of the solution there is a clear decrease in the size or even complete removal of the morphological peaks formed under the action of the laser beam (FIG. 3), this topological affect being associated with electrical isolation of the edges of the laser-etched regions, which isolation is observed by CAFM (FIG. 4). Specifically CAFM (conducting atomic force microscopy) observations demonstrate the reduction in the local conductivity peak corresponding to the morphological peak. Therefore, leakage currents measured for OLED devices are significantly reduced. They may be divided by a factor of 10 or more, even of 100 or more.

3D microscopy was carried out using a Leica DCM 3D microscope. The magnification used for all of the images was 50 times. The X-axis and Y-axis scales shown on the 2D profiles correspond to the 3D images (order of magnitude for the observed profiles: about 100 μm wide and 100 nm deep). The microscope was used in confocal mode, i.e. the 3D representation of the observed sample was formed from a set of images taken at different depths in the sample. The sections were obtained by positioning the focal plane of the object at these various depths.

The CAFM measurements were taken using a Veeco™ tool. The conducting AFM allowed a topographical image and an electrical image (conductivity measurement) of the observed sample to be captured simultaneously. The characteristics of the tool used are given in table II.

TABLE II

| characteristics of the CAFM used | |
|---|---|
| Scanning mode | contact |
| Conductive tip | $PtIr_5$ on a Si tip |
| Spatial resolution | 20 nm |
| Sensitivity of the module | 100 fA |

The chemical composition of the passivating solution, its thiosulfate concentration and its temperature are adjusted so that only the superficial materials present at the edges of the laser-etched region are removed, the active surface of the electrically conductive functional film not being affected in any way.

The exposure time must be adjusted so as to allow the morphological peaks formed under the action of the laser beam to be removed without causing any additional topographical damage. Specifically, a prolonged exposure time may cause secondary morphological peaks to form, as shown in FIG. 5. FIG. 5 illustrates the topography of a laser-etched line observed by 3D microscopy before submersion in the passivating solution, and after submersion for 5 minutes and 15 minutes. The appearance of secondary peaks after submersion for 15 minutes will be noted. Table III shows succinctly the effect of the concentration of the passivation solution as a function of the treatment time, said treatment being carried out at room temperature (~25° C.).

TABLE III effect of passivating treatment time as a function of the concentration of the passivating solution

| | Concentration | | |
|---|---|---|---|
| Treatment time in minutes | 0.5M | 1.0M | 2.0M |
| 5 min | = | + | ++ |
| 10 min | = | ++ | − |
| 15 min | + | − | −− |

Where −−, −, =, +, and ++ respectively represent a very detrimental, detrimental, equivocal, positive and very positive effect on the topography. The topographical effect was judged to be positive in character when the peaks, related to the laser etching, decreased in size or completely disappeared, and was judged to be negative when secondary peaks appeared.

The influence of temperature was not tested but it is well known to those skilled in the art that dissolution kinetics are improved by increasing temperature.

Figure 6:
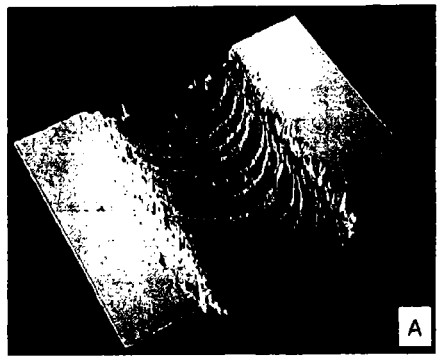
FIG. 6 shows the topography observed by 3D microscopy after 5 minutes of passivation with (B) and without (A) ultrasound being used during the rinsing.
Figure 6:
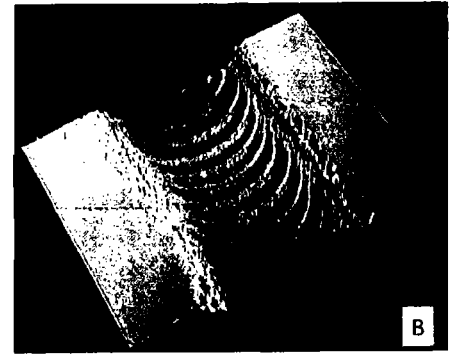

The use of ultrasound, during the passivation or rinsing, preferably during the rinsing, improves the topographical properties of the edges of the laser-etched regions, and acts to remove any residues from the chemical reaction, as illustrated by FIG. 6. FIG. 6 is a 3D micrograph, taken using a 3D microscope, of a substrate according to the invention after passivation for 5 minutes in a sodium thiosulfate solution, with (B) and without (A) ultrasound being used during the rinsing in deionized water.

Figure 7:
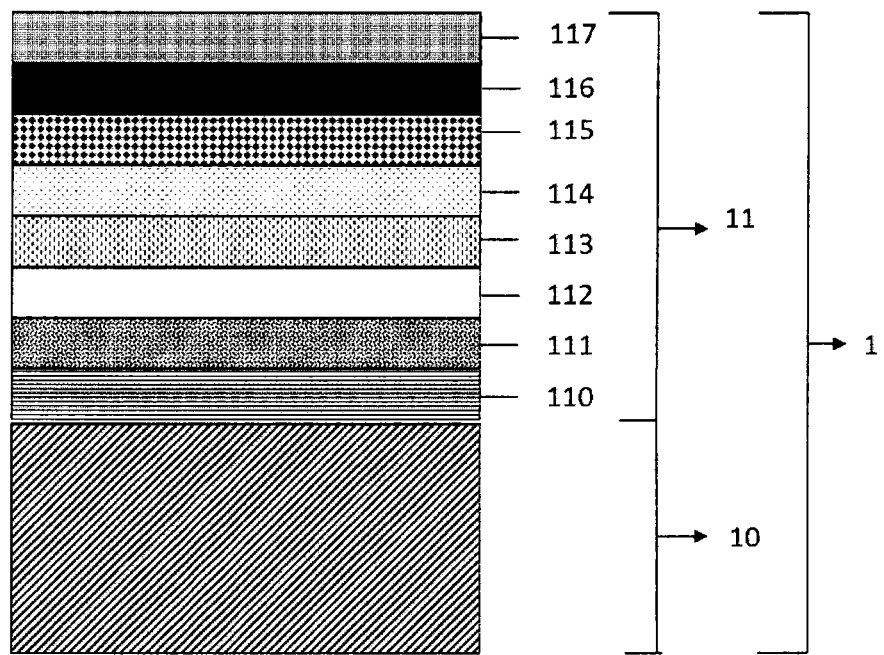
FIG. 7 shows a schematic of an exemplary substrate according to the invention.

FIG. 7 shows an exemplary substrate (1), said substrate comprising a carrier (10) and a functional film (11), said functional film comprising, in succession, starting from the carrier (10):
 a barrier film (110);
 an optical optimization film (111);
 a crystallization film (112);
 a sacrificial film (113);
 a metallic silver-based film (114);
 a sacrificial film (115);
 an insertion film (116); and
 a film promoting uniform surface electrical properties (117), said substrate being subjected to the passivating treatment.

Exemplary substrates comprising a glass carrier and a low-E functional film that could be subjected to said passivating treatment are given in Table IV.

TABLE IV

Table IV: Examples of substrates that could be passivated, said substrate consisting of an extra-clear glass substrate covered with one of the following functional films

| Functional film | Ex IV.1 nature (thickness [nm]) | Ex IV.2 nature (thickness [nm]) | Ex IV.3 nature (thickness [nm]) | Ex IV.4 nature (thickness [nm]) | Ex IV.5 nature (thickness [nm]) | Ex IV.6 nature (thickness [nm]) |
|---|---|---|---|---|---|---|
| Barrier film | ZSO5 (22.0) | ZSO5 (27.0) | ZSO5 (24.0) | TiO$_2$ (60.0) | ZSO5 (83.0) | TiO$_2$ (20.0) |
| Crystallization film | ZSO9 (9.0) | ZSO9 (9.0) | ZSO9 (8.0) | ZnAlO (10.0) | ZnO (10.0) | ZnO (8.0) |
| Metallic Ag-based film | Ag (8.0) | Ag (8.0) | Ag (8.0) | Ag 125 mg/m$^2$ | Ag 125 mg/m$^2$ | Ag 115 mg/m$^2$ |
| Sacrificial film | NiCr (1.0)/Ti (2.5) | Ti (3.0) | Ti (5.0) | Ti (2.0) | Ti (2.0) | Ti (2.0) |
| Insertion film | ZSO5 (55.5) | ZSO5 (52.5) | ZSO5 (55.0) | ZnAlO (7.0) | ZnAlO (7.0) | ZSO5 (30.0) |
| Crystallization film | ZSO9 (8.5) | ZSO9 (12.0) | ZSO9 (10.0) | — | — | — |
| Metallic Ag-based film | Ag (14.7) | Ag (14.5) | Ag (15.0) | — | — | — |
| Absorbent film | — | — | Pd (1.8) | — | — | — |
| Sacrificial film | NiCr (1.0)/Ti (2.5) | Ti (3.0) | Ti (2.5) | — | — | — |
| Insertion film | ZSO9 (8.5)/ZSO5 (24.0) | ZSO9 (9.0)/ZSO5 (20.0) | ZSO9 (7.0)/ZSO5 (15.0) | — | — | TZO (15.0) |
| Film for promoting uniform surface electrical properties | TiN (3.0) | TiN (3.0) | TiN (2.0) | TiN (1.5) | TiN (1.5) | — |

ZSO5 = mixed zinc tin oxide obtained by sputtering a metal ZnSn-alloy target comprising 52% Zn and 48% Sn in an oxidizing atmosphere
ZSO9 = mixed zinc tin oxide obtained by sputtering a metal ZnSn-alloy target comprising 90% Zn and 10% Sn in an oxidizing atmosphere
TZO = mixed titanium zirconium oxide obtained by sputtering a metal TiZr-alloy target comprising 50% Ti and 50% Zr in an oxidizing atmosphere

The invention claimed is:

1. A substrate, comprising a carrier comprising, on at least one of its main faces, a functional film providing electrical conduction properties,
wherein:
the functional film comprises at least one metallic film and, on its extreme surface opposite the carrier, at least one thiosulfate, and
the functional film comprises a uniformity-promoting film which promotes uniform surface electrical properties and, within the functional film, is furthest from the carrier.

2. The substrate of claim 1, wherein the functional film comprises at least one metallic silver-based film.

3. The substrate of claim 1, wherein the functional film comprises at least one barrier film.

4. The substrate of claim 2, wherein the metallic silver-based film comprises, on at least one of its faces, at least one sacrificial film.

5. The substrate of claim 2, wherein the functional film comprises at least one optical optimization film situated between the metallic silver-based film and the carrier.

6. The substrate of claim 2, wherein the functional film comprises at least one crystallization film situated between the carrier and the metallic silver-based film.

7. The substrate of claim 2, wherein the functional film comprises at least one insertion film situated between the metallic silver-based film and a thin uniformity-promoting film.

8. The substrate of claim 1, wherein the functional film is a discontinuous film in the form of separate adjacent zones.

9. A process for increasing uniformity of a surface of a substrate comprising a carrier comprising, on at least one of the carrier's main faces, a functional film providing electrical conduction properties, wherein the film comprises at least one metallic film, the process comprising in succession:
depositing the functional film;
etching the functional film by laser etching; and
applying an aqueous solution comprising thiosulfate anions.

10. The process of claim 9, wherein the applying of the aqueous solution occurs with stirring.

11. The process of claim 9, wherein a thiosulfate anion concentration of the aqueous solution is 0.1 M or higher.

12. The process of claim 9, wherein a duration of the applying (t in mins) with respect to a concentration of the thiosulfate anions in the aqueous solution (c in M) is at least equal to $t=4e^{-0.139c}-0.25$ and at most equal to $t=4e^{-0.139c}+0.25$.

13. An optoelectronic device, comprising the substrate of claim 1.

14. The substrate of claim 1, wherein the functional film is a discontinuous film in the form of parallel strips.

15. The process of claim 9, further comprising after the applying, rinsing in a water-based solvent to increase the uniformity of the substrate surface.

16. The process of claim 9, wherein the functional film comprises at least one metallic silver-based film.

17. The process of claim 9, wherein the functional film comprises at least one barrier film.

18. The process of claim 9, wherein the metallic silver-based film comprises, on at least one of its faces, at least one sacrificial film.

19. The process of claim 9, wherein the functional film comprises a uniformity-promoting film which promotes uniform surface electrical properties and, within the functional film, is furthest from the carrier.

20. The process of claim 9, wherein the functional film comprises at least one optical optimization film situated between the metallic silver-based film and the carrier.

21. The process of claim 9, wherein the functional film comprises at least one crystallization film situated between the carrier and the metallic silver-based film.

22. The process of claim 9, wherein the functional film comprises at least one insertion film situated between the metallic silver-based film and a thin uniformity-promoting film.

23. The process of claim 9, wherein the functional film is a discontinuous film in the form of separate adjacent zones.

24. The process of claim 9, wherein the functional film is a discontinuous film in the form of separate adjacent zones in the form of parallel strips.

25. A process for increasing uniformity of a surface of a substrate comprising a carrier comprising, on at least one of its main faces, a functional film providing electrical conduction properties, wherein the film comprises at least one metallic film, the process comprising in succession:
depositing the functional film;

etching the functional film; and applying an aqueous solution comprising thiosulfate anions, wherein a duration of the applying (t in mins) with respect to a concentration of the thiosulfate anions in the aqueous solution (c in M) is at least equal to $t=4e-0.139c-0.25$ and at most equal to $t=4e-0.139c+0.25$.

* * * * *